(12) United States Patent
Jing et al.

(10) Patent No.: US 11,043,470 B2
(45) Date of Patent: Jun. 22, 2021

(54) INDUCTOR DESIGN IN ACTIVE 3D STACKING TECHNOLOGY

(71) Applicant: XILINX, INC., San Jose, CA (US)

(72) Inventors: Jing Jing, San Jose, CA (US); Shuxian Wu, San Jose, CA (US); Xin X. Wu, Fremont, CA (US); Yohan Frans, Palo Alto, CA (US)

(73) Assignee: XILINX, INC., San Jose, CA (US)

( * ) Notice: Subject to any disclaimer, the term of this patent is extended or adjusted under 35 U.S.C. 154(b) by 51 days.

(21) Appl. No.: 16/694,476

(22) Filed: Nov. 25, 2019

(65) Prior Publication Data
US 2021/0159212 A1     May 27, 2021

(51) Int. Cl.
| H01L 25/065 | (2006.01) |
|---|---|
| H01L 23/64 | (2006.01) |
| H01L 23/522 | (2006.01) |
| H01L 25/00 | (2006.01) |
| H01L 49/02 | (2006.01) |
| H01L 21/48 | (2006.01) |
| H01L 23/538 | (2006.01) |

(52) U.S. Cl.
CPC ........ *H01L 25/0652* (2013.01); *H01L 21/486* (2013.01); *H01L 23/5227* (2013.01); *H01L 23/5381* (2013.01); *H01L 23/645* (2013.01); *H01L 25/50* (2013.01); *H01L 28/10* (2013.01)

(58) Field of Classification Search
CPC . H01L 25/0652; H01L 25/50; H01L 23/5381; H01L 23/5227; H01L 23/645; H01L 21/486
USPC ............... 257/686, 292, 432, 531, 435, 774, 257/E21.022, E21.499, E21.575, E21.586, 257/E27.13, E27.132, E27.133, E29.002, 257/E29.166, E29.325, E31.097, E31.127; 348/294; 438/107, 381, 59, 66, 674
See application file for complete search history.

(56) References Cited

U.S. PATENT DOCUMENTS

| 8,427,266 | B2 | 4/2013 | Wu et al. |
|---|---|---|---|
| 8,860,180 | B2 | 10/2014 | Jing et al. |
| 10,217,703 | B2 | 2/2019 | Upadhyaya et al. |
| 10,446,485 | B2 * | 10/2019 | Uchida ............... H01L 23/5227 |
| 10,453,888 | B2 * | 10/2019 | Kobayashi ........ H01L 27/14603 |

(Continued)

FOREIGN PATENT DOCUMENTS

| WO | 2012128832 A1 | 9/2012 |
|---|---|---|
| WO | 2018053137 A1 | 3/2018 |

*Primary Examiner* — Dao H Nguyen
(74) *Attorney, Agent, or Firm* — Patterson + Sheridan, LLP (57) ABSTRACT

Examples described herein provide for an isolation design for an inductor of a stacked integrated circuit device. An example is a multi-chip device comprising a chip stack comprising: a plurality of chips, neighboring pairs of the plurality of chips being bonded together, each chip comprising a semiconductor substrate, and a front side dielectric layer on a front side of the semiconductor substrate; an inductor disposed in a backside dielectric layer of a first chip of the plurality of chips, the backside dielectric layer being on a backside of the semiconductor substrate of the first chip opposite from the front side of the semiconductor substrate of the first chip; and an isolation wall extending from the backside dielectric layer of the first chip to the front side dielectric layer, the isolation wall comprising a through substrate via of the first chip, the isolation wall being disposed around the inductor.

20 Claims, 9 Drawing Sheets

(56) References Cited

U.S. PATENT DOCUMENTS

| | | | |
|---|---|---|---|
| 10,903,216 B2* | 1/2021 | Kim | ............ H01L 27/10891 |
| 2009/0090995 A1 | 4/2009 | Yang et al. | |
| 2010/0308471 A1* | 12/2010 | Korogi | ............ H01L 24/05 |
| | | | 257/774 |
| 2015/0084158 A1 | 3/2015 | Tsai et al. | |
| 2016/0379958 A1 | 12/2016 | Kuroda | |
| 2018/0076134 A1* | 3/2018 | Jing | ............ H01L 23/5225 |
| 2019/0109123 A1* | 4/2019 | Kao | ............ H01L 25/0657 |
| 2019/0122931 A1* | 4/2019 | Huang | ............ H01L 21/76898 |
| 2019/0229113 A1 | 7/2019 | Wu et al. | |
| 2019/0371727 A1* | 12/2019 | Kuwabara | ............ H01L 23/5227 |

\* cited by examiner

FIG. 6

INDUCTOR DESIGN IN ACTIVE 3D STACKING TECHNOLOGY

TECHNICAL FIELD

Examples of the present disclosure generally relate to inductors and, in particular, to inductor designs for stacked integrated circuit packages.

BACKGROUND

Inductors and transformers have been extensively used in radio frequency (RF) integrated circuit (IC) designs, including LC VCO circuits, Accurate and predictable inductor characteristics with high quality factors are desirable for successful RF IC design, especially for LC VCO circuits, in order to meet product performance and frequency targets. As technology continues to evolve, the number of devices dramatically increases within a given area of an IC. This increased density in an IC can cause increased parasitic effects on devices or circuits.

The environmental effect can dramatically degrade an inductor quality factor (Q-factor) and alter its inductance value from its modeled behavior, causing products to be unable to meet their intended performance and causing shifts in frequency from their design targets. The environmental effect is hard to predict before manufacture because various direct current (DC) or alternating current (AC) loops can be formed as a return path by the surrounding circuits, power grids, and complicated routings around the inductors.

SUMMARY

Examples described herein provide for an isolation design for an inductor of a stacked integrated circuit device. An example is a multi-chip device comprising a chip stack comprising a plurality of chips, neighboring pairs of the plurality of chips being bonded together, each chip comprising a semiconductor substrate, and a front side dielectric layer on a front side of the semiconductor substrate; an inductor disposed in a backside dielectric layer of a first chip of the plurality of chips, the backside dielectric layer of the first chip being a backside of the semiconductor substrate of the first chip opposite from the front side of the semiconductor substrate of the first chip; and an isolation wall extending from the backside dielectric layer of the first chip to the front side dielectric layer of the first chip, the isolation wall comprising a through substrate via (TSV) of the first chip, the isolation wall being disposed around the inductor.

Another example is a method for constructing a multi-chip device. The method comprises forming a stack of a plurality of chips comprising forming the plurality of chips, each chip comprising a semiconductor substrate, and a front side dielectric layer on a front side of the semiconductor substrate wherein forming a first chip of the plurality of chips includes: forming an inductor disposed in a backside dielectric layer of the first chip of the plurality of chips, the backside dielectric layer being on a backside of the semiconductor substrate of the first chip opposite from the front side; and forming an isolation wall extending from the backside dielectric layer of the first chip to the front side dielectric layer of the first chip, the isolation wall comprising a through-substrate via (TSV) through the semiconductor substrate of the first chip, the isolation wall being disposed around the inductor.

Another example is a multi-chip device, comprising: a chip stack; an inductor disposed in a backside dielectric layer of a first chip of the chip stack; and an isolation wall extending from the backside dielectric layer of the first chip to the front side dielectric layer of the first chip, the isolation wall being disposed around the inductor.

Aspects generally include methods as substantially described herein with reference to and as illustrated by the accompanying drawings.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example does not need to have all the aspects or advantages shown. An aspect or an advantage described in conjunction with a particular example is not necessarily limited to that example and can be practiced in any other examples even if not so illustrated, or if not so explicitly described.

In active 3D stacking, multiple chips are bonded vertically together, which can provide high-density multi-functional devices. The electrical and magnetic parasitic interactions between the chips is accordingly three dimensional, and these three-dimensional electrical and magnetic parasitic interactions can affect and modulate an IC with an inductor and surrounding circuits. In some cases, the inductor of the IC can become unpredictable in an integrated Active-on-Active (AoA) environment (referred herein as a stacked IC environment). The inductor performance can be dramatically degraded, which can cause the IC chip (which can include a voltage controlled oscillator (VCO) circuit) to not meet its performance metrics. In some cases, the inductor can no longer function in the stacked IC environment. These problems are especially severe for inductors with sub-nano Henry inductance that are often used for high speed VCO circuits in advanced semiconductor technologies.

Accordingly, examples herein describe an IC design to effectively isolate the uncertain 3D environmental effects on an inductor and yield stable and predictable inductor characteristics in the stacked IC environment.

Examples described herein describe a multi-chip device with an isolation wall surrounding an inductor. The isolation wall can assist in isolating the environmental effects arising in the stacked IC environment (e.g., including environmental effects from vertically stacked chips stacked on the chip on which the inductor is disposed).

The multi-chip device includes a plurality of chips, each chip comprising a semiconductor substrate having a backside and a front side opposite the backside. The multi-chip device includes an inductor disposed on the backside of a first chip of the plurality of chips, and an isolation wall disposed from the backside of the first chip to the front side of the first chip. The isolation wall passes through one or more backside through substrate vias (BTSVs) of the first chip and is disposed around the inductor. The isolation wall surrounding the inductor disclosed herein can be used with stacked devices, such as including active-on-active (AoA) chips.

Concepts described herein can be extended to chips of a multi-chip device having any IC. As used herein, "processing integrated circuit" or "processing IC" refers to an IC comprising a circuit capable of, configured to, and/or configurable to process or manipulate data, as opposed to memory that merely stores data and any circuit ancillary to memory (e.g., a memory controller, an address decoder, etc.). A processing IC may include memory in addition to a circuit capable of, configured to, and/or configurable to process or manipulate data. Examples of processing ICs include ICs including a programmable logic region (e.g., FPGA), a processor (e.g., a central processing unit (CPU), graphics processing unit (GPU), etc.), an application specific integrated circuit (ASIC), the like, or a combination thereof.

Figure 1:
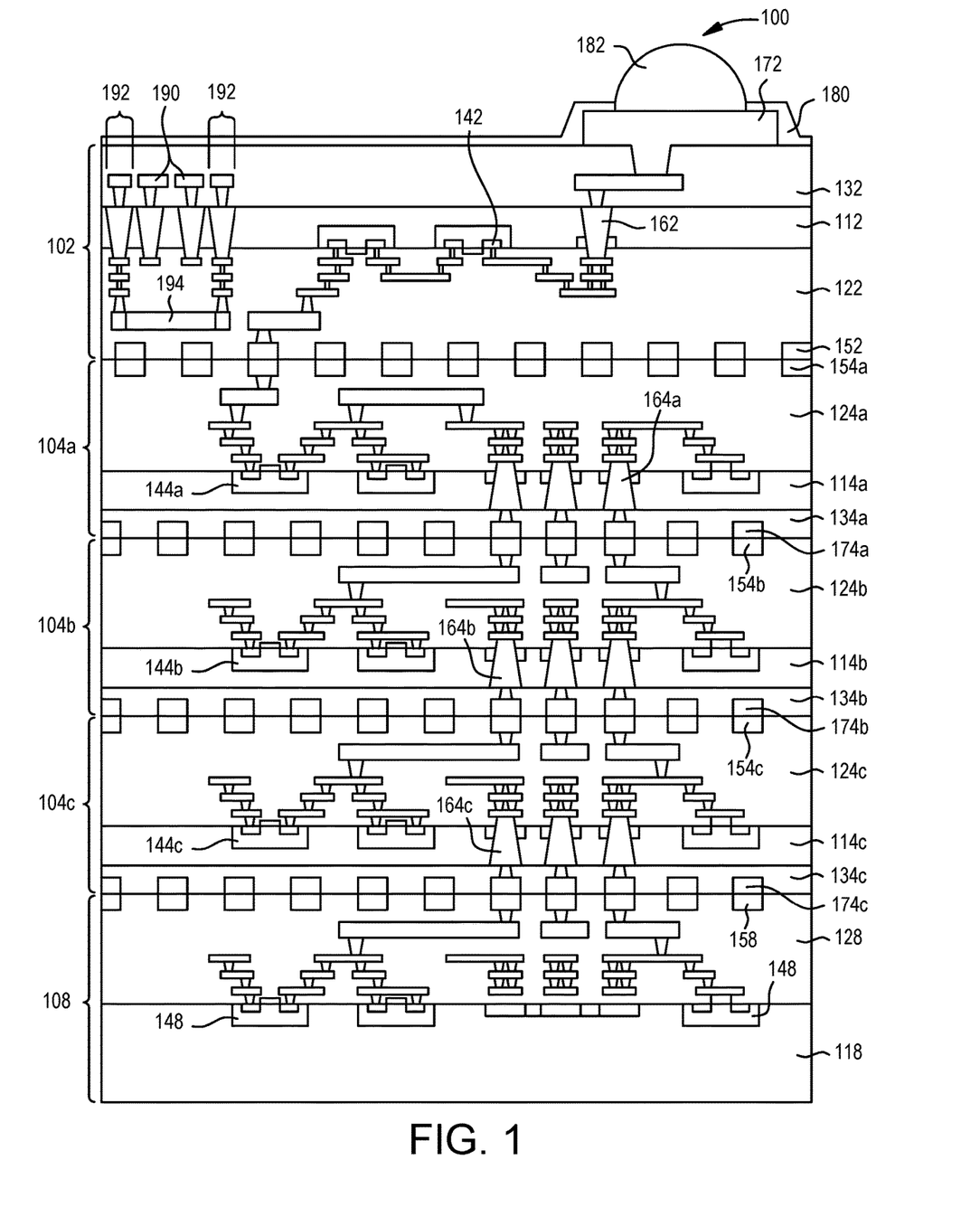
FIG. 1 is a cross-section of a multi-chip device, according to some examples.

FIG. 1 is a structure of a multi-chip device according to some examples. The multi-chip device of FIG. 1 includes a chip stack that includes a base chip 102, intermediate chips 104a, 104b, 104c (collectively or individually, intermediate chip(s) 104), and a distal chip 108. In the multi-chip device of FIG. 1, the intermediate chips 104 are arranged active or front side facing towards the base chip 102. Various other multi-chip devices can have different structures, different number of chips, additional components, etc.

Referring to FIG. 1, generally, the chips 102, 104a, 104b, 104c, 108 are stacked and form a chip stack in the multi-chip device. The chips 102, 104a, 104b, 104c, 108 are stacked to form, in some examples, an Active chip-on-Active chip (AoA) device. In some examples, more or fewer chips can be included in the chip stack. For example, one or more of the intermediate chips 104 can be removed from or added into a chip stack. In some examples, the chip stack can be or include two chips, such as the base chip 102 bonded to an intermediate chip 104. In another example, the chip stack can be or include two other chips, such as the base chip 102 bonded to the distal chip 108. In further examples, the chip stack can be or include three chips (e.g., the base chip 102 bonded to an intermediate chip 104, which is bonded to the distal chip 108), four chips (e.g., the base chip 102, two intermediate chips 104, and the distal chip 108), etc. In some examples, the base chip 102 is an input/output (I/O) chip, and the intermediate chips 104 and distal chips 108 are chips having a programmable IC that include programmable logic regions (e.g., fabric chips).

Each of the chips 102, 104a, 104b, 104c, 108 includes a respective semiconductor substrate 112, 114a, 114b, 114c 118 and respective front side dielectric layer(s) 122, 124a, 124b, 124c, 128 on a front side of the respective semiconductor substrate 112, 114a, 114b, 114c 118. The front side dielectric layer(s) 122, 124a, 124b, 124c, 128 include metallization (e.g., metal lines and/or vias) (illustrated but not specifically numbered) formed therein which can electrically connect various components in an IC. Each of the chips 102, 104a, 104b, 104c includes backside dielectric layer(s) 132, 134a, 134b, 134c on a backside of the respective semiconductor substrate 112, 114a, 114b, 114c. The backside dielectric layer(s) 132, 134a, 134b, 134c include metallization (e.g., metal lines and/or vias) (illustrated but not specifically numbered) formed therein which can electrically connect various components in an IC. Each semiconductor substrate 112, 114a, 114b, 114c, 118 of the chips 102, 104a, 104b, 104c, 108 includes, e.g., one or more transistors 142, 144a, 144b, 144c, 148 formed on and/or in the front side surface of the respective semiconductor substrate 112, 114a, 114b, 114c, 118. The transistor(s) 142, 144a, 144b, 144c, 148 and any other components can be connected to the metallization (illustrated but not labeled) in the front side dielectric layer(s) 122, 124a, 124b, 124c, 128. Each semiconductor substrate 112, 114a, 114b, 114c of the respective chip 102, 104a, 104b, 104c has backside through-substrate via(s) (TSV(s)) 162, 164a, 164b, 164c therethrough, which can electrically connect the metallization in the front side dielectric layer(s) 122, 124a, 124b, 124c to the metallization in the backside dielectric layer(s) 132, 134a, 134b of the respective chip 102, 104a, 104b, 104c.

Front side bond pads 152, 154a, 154b, 154c, 158 (e.g., metal (e.g., Cu) bond pads) are formed in the respective front side dielectric layer(s) 122, 124a, 124b, 124c, 128 of the chips 102, 104a, 104b, 104c, 108 at an exterior surface distal from the respective semiconductor substrate 112, 114a, 114b, 114c, 118. The front side bond pads 152, 154a, 154b, 154c, 158 can be in an arrangement that forms a respective chip-to-chip interface. The front side bond pads 152, 154a, 154b, 154c, 158 are connected to the metallization in the respective front side dielectric layer(s) 122, 124a, 124b, 124c, 128. Backside bond pads 174a, 174b, 174c (e.g., metal (e.g., Cu) bond pads) are formed in the respective backside dielectric layer(s) 134a, 134b, 134c of the chips 104a, 104b, 104c at an exterior surface distal from the respective semiconductor substrate 114a, 114b, 114c. The backside bond pads 174a, 174b, 174c can be in an arrangement that forms a respective chip-to-chip interface. The backside bond pads 174a, 174b, 174c are connected to the metallization in the respective backside dielectric layer(s) 134a, 134b, 134c.

Exterior connector backside pads 172 (e.g., metal (e.g., aluminum) pads) are formed in the backside dielectric layer(s) 132 of the base chip 102 at an exterior surface distal from the semiconductor substrate 112 of the base chip 102. The exterior connector backside pads 172 are connected to the metallization in the backside dielectric layer(s) 132 of the base chip 102. A passivation layer 180 is formed on the exterior surface distal from the semiconductor substrate 112 of the base chip 102 with respective openings therethrough exposing the exterior connector backside pads 172. External connectors 182 (e.g., controlled collapse chip connections (C4), minibumps, etc.) are formed on respective exterior connector backside pads 172 through the openings in the passivation layer 180.

The external connectors 182 can be attached to a package substrate. The package substrate may further be attached to, e.g., a printed circuit board (PCB) to attach the package substrate (and hence, the multi-chip device) to the PCB. Various other components can be included in a multi-chip device. For example, an interposer, an encapsulant (such as a molding compound (MUF) or the like), etc. can be included in the multi-chip device. A person having ordinary skill in the art will readily envision various modifications that can be made to the multi-chip device.

As described above, in some examples, the chips 102, 104a, 104b, 104c, 108 are bonded (e.g., by hybrid bonding using metal-to-metal and oxide-to-oxide bonding) together to form a chip stack. Referring to FIG. 1, the base chip 102 is bonded to the intermediate chip 104a front side to front side such that the front side bond pads 152 and exterior surface of the front side dielectric layer(s) 122 of the base chip 102 are bonded to the front side bond pads 154a and exterior surface of the front side dielectric layer(s) 124a of the intermediate chip 104a. The intermediate chip 104a is bonded to the intermediate chip 104b backside to front side such that the backside bond pads 174a and exterior surface of the backside dielectric layer(s) 134a of the intermediate chip 104a are bonded to the front side bond pads 154b and exterior surface of the front side dielectric layer(s) 124b of the intermediate chip 104b. Similarly, the intermediate chip 104b is bonded to the intermediate chip 104c backside to front side. The intermediate chip 104c is bonded to the distal chip 108 backside to front side such that the backside bond pads 174b and exterior surface of the backside dielectric layer(s) 134b of the intermediate chip 104c are bonded to the front side bond pads 158 and exterior surface of the front side dielectric layer(s) 128 of the distal chip 108.

In some examples, an inductor 190 is formed in the backside dielectric layer(s) 132 of the base chip 102. Forming the inductor 190 in the backside dielectric layer(s) 132 of the base chip 102 increases the distance between the inductor 190 and metallization of intermediate chip 104a. In some examples, the inductor 190 is formed in the backside dielectric layer(s) 132 of the base chip 102, while devices (e.g., transistors) of other I/O circuits (e.g., GM cell, fine-tuning, and course-tuning circuits) are formed on the front side of the semiconductor substrate 112 the base chip 102.

In some examples, an isolation wall 192 and pattern ground shield (PGS) 194 can provide additional isolation for the inductor 190 from environmental effects of the stacked IC environment.

As illustrated, the isolation wall 192 is disposed in the base chip 102 around the inductor 190, and extends from the metallization layer in the backside dielectric layer(s) 132 of the base chip 102 to an upper metallization layer in the front side dielectric layer(s) 122 of the base chip 102. In some examples, the isolation wall 192 is formed by conductive metal lines and vias in the metallization of the base chip 102. The isolation wall 192 can include metal lines in the same metallization layer as the inductor 190, and can be connected to through substrate vias (TSVs), which in turn are connected to vias and metal lines in the metallization on the front side of the base chip 102. In some examples, the isolation wall 192 includes conductive lines and/or vias in metallization in adjacent chips (e.g., intermediate chip 104a), which can be connected to the portion of the isolation wall on the base chip 102 by bonded front side bond pads 152 and 154a.

Figure 2A:
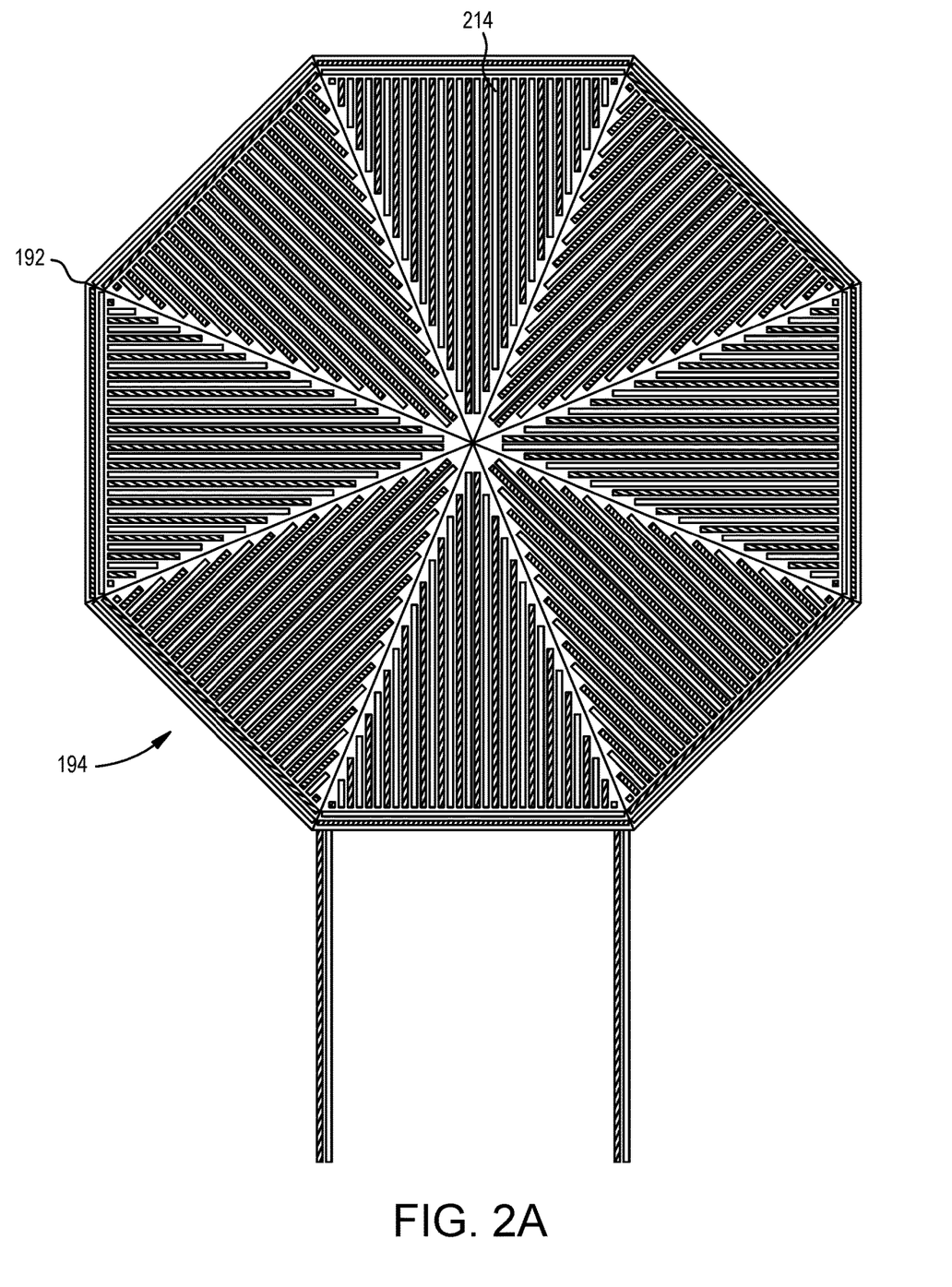
FIGS. 2A and 2B illustrate a layout of an isolation wall and a patterned ground shield (PGS) around an inductor, according to some examples.
Figure 2B:
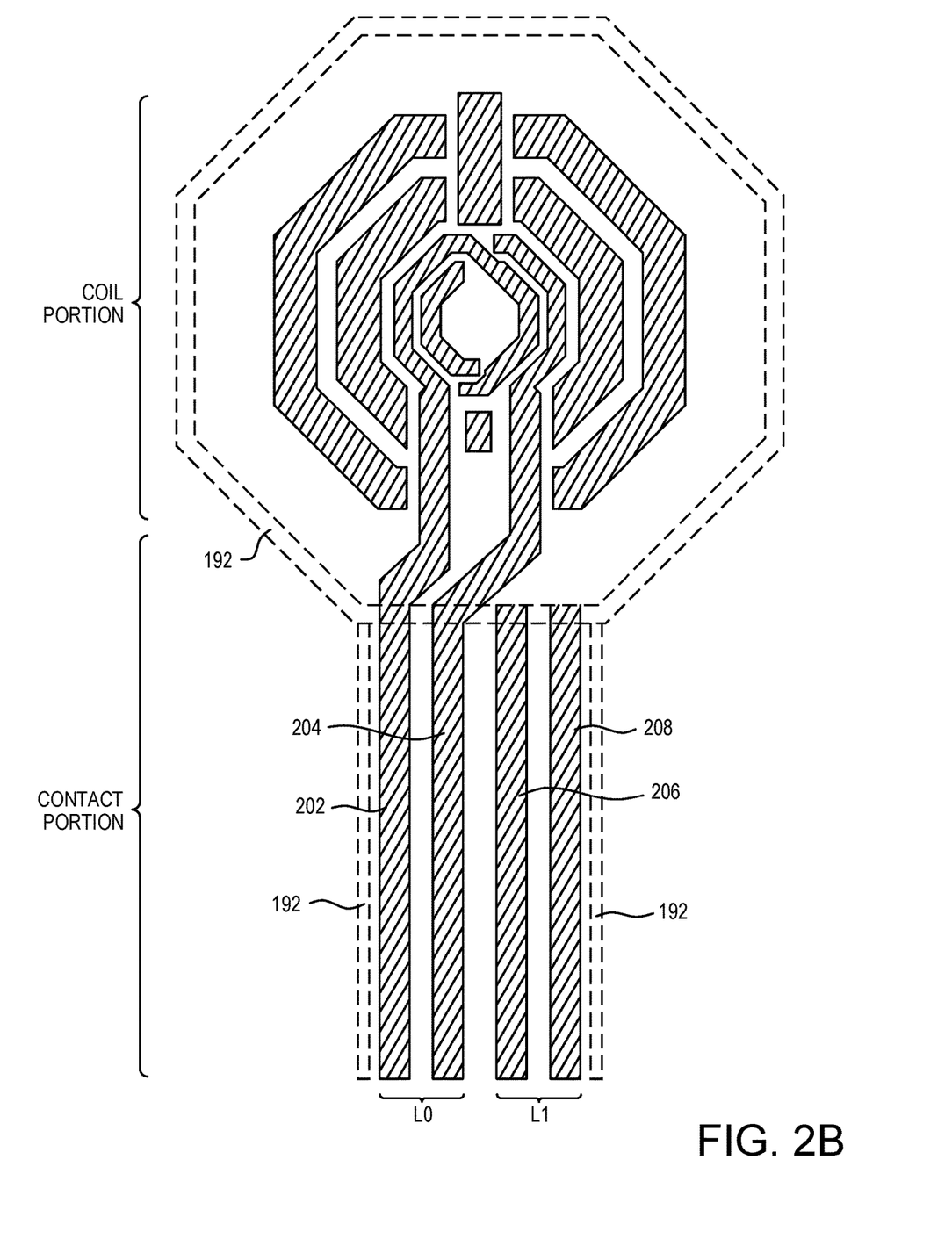

As illustrated in FIGS. 2A and 2B, the isolation wall 192 can have any shape, size, and location to improve circuit performance (e.g., to improve chip area utilization, to reduce coupling effect with other devices located in the chip, etc.). In some examples, the thickness of the isolation wall may be tuned to adjust the resistance of the isolation wall (e.g., reducing the resistance by increasing the thickness of the isolation wall). In some examples, portions of the isolation wall 192 may have different thicknesses determined based on resistance requirements and the available space.

As illustrated, the isolation wall 192 extends through the front side dielectric layer(s) 122 to a PGS 194 disposed in an upper metallization layer in the front side dielectric layer(s) 122 of the base chip 102. The PGS 194 can assist in shielding environmental effects from the intermediate chip(s) 104 and/or distal chip 108. In such examples, the PGS 194 is inserted between (i) the inductor 190 and (ii) the intermediate chips 104 and the distal chip 108. In some examples, the PGS 194 is disposed in the top metallization layer in the base chip 102 so the distance between the inductor 190 and the PGS 194 is maximized within the base chip 102 to minimize parasitic capacitance. For example, the PGS 194 is disposed in the topmost metallization layer in the front side dielectric layer(s) 122 of the base chip 102 while the inductor 190 is disposed in the backside dielectric layer(s) 132 of the base chip 102.

The PGS 194 can be disposed in any chip of the multi-chip device 100, and the isolation wall 192 can extend through any number of front side dielectric layers, backside dielectric layers, and TSVs to reach the PGS 194. The PGS 194 is described in further detail with reference to FIGS. 2A and 2B.

Where intermediate chips 104 are bonded front side to backside, the isolation wall 192 can be electrically connected and extend through the backside TSVs 164 and bond pads bonded between the base chip 102 and intermediate chips 104. The inductor 190 can be disposed in the front side or the backside dielectric layers of a chip depending on the circuit requirement. The inductor 190 and the other circuits are electrically connected through interconnect metals on the same chip or through backside TSVs 162, 164a, 164b, 164c and/or bonding for cross-chip cases.

The backside TSVs 162, 164a, 164b, 164c electrically connect metallization(s) in the backside dielectric layer(s) with these circuits in the base chip 102, and can reduce the parasitic resistance of the isolation wall 192, which also benefits from the higher density BTSV of a thinner semiconductor substrate.

In some examples, the electrical grounds for each chip of the multi-chip device 100 can be electrically connected together through controlled collapse chip connection (C4) bumps at a package level in the stacked IC environment. The electrically connected grounds can form various returning paths, which can be different based on the surrounding environments. These various returning paths can modulate the inductor characteristics. The metallization of the intermediate chip 104 underneath the inductor can act as a conducting mirror, which can terminate the magnetic field and cause dramatic degradation on inductor Q-factor.

Accordingly, the multi-chip device with an isolation wall as described herein can be optimized to achieve the highest device performance within a given chip area and metal scheme with a desired inductance value. In some examples, the C4 bump geometry in packaging is also considered so that the inductor and the isolation wall can fit in the empty area between C4 bumps to minimize the impact from the bumps.

In some examples, the distance between the inductor and the semiconductor substrate of a chip is shorter compared to the distance in a single (i.e., monolithic) chip. In some examples, loss caused by a highly doped semiconductor substrate can significantly degrade inductor performance. Accordingly, in some examples, a region of the semiconductor substrate vertically corresponding with the location of the inductor 190 (e.g., surrounded by the TSVs of the isolation wall 192) can comprise or be a highly resistive semiconductor material, such as an intrinsic semiconductor material, like intrinsic silicon. In another example, the semiconductor substrate can have a certain thickness to reduce substrate loss. In some examples, the thickness of the semiconductor substrate 112 of the base chip 102 is less than or equal to 2.7 um.

FIGS. 2A and 2B illustrate an isolation wall 192 around a PGS 194 and an inductor 190, according to some examples. As described with FIG. 1, the isolation wall 192 is formed in the backside dielectric layer(s) 132 of the base chip 102 and through backside TSVs 162, and is designed to isolate the inductor 190 from the environmental effects and to maintain the quality factor (Q-factor) of the inductor.

FIG. 2A is a top view of a PGS and isolation wall. As mentioned, a PGS 194 associated with the inductor enables shielding and enhances the Q-factor of the inductor 190. In some examples, the PGS 194 may include groups of parallel, conductive fingers 214, and may be coupled together at the outer perimeter. These fingers 214 can be constructed to be perpendicular to the current direction of the inductor 190 to minimize eddy current and reduce magnetic loss. The PGS 194 and the isolation wall 192 may isolate the electrical field generated by current flow through devices disposed over the PGS 194 (e.g., inductor 190) from devices in a region disposed between the PGS 194 and the semiconductor substrate 112.

The PGS 194 can be shaped as an octagon to match the shape of the coil portion of the inductor 190. The isolation wall 192 extends up from the PGS 194, and in some examples, the isolation wall 192 can surround the PGS 194. In some examples, the isolation wall 192 includes a portion adjacent to legs of a transformer (shown in FIG. 2B).

In some examples, by implementing the PGS 194 in a metal layer adjacent to a top-most metal layer of the front side dielectric layer(s) 122 of the base chip 102, more distance between the PGS 194 and the inductor 190 may be achieved to improve circuit performance. The PGS 194 can be formed from conductive materials such as aluminum, copper, aluminum/silicon/copper alloy, titanium, titanium nitride, tantalum, tantalum nitride, tungsten, polysilicon, other suitable conductive materials, or combinations thereof.

FIG. 2B illustrates a top view of the isolation wall 192 around an inductor 190, which in this example is in a transformer (e.g., which includes two inductors). In other examples, the inductor 190 can be merely an inductor, and a person having ordinary skill in the art will readily understand such a structure, particularly in view of FIG. 2B. In some examples, the transformer includes an outer inductor L1 and an inner inductor L0. Inner inductor L0 is placed inside the outer inductor L1. Each of the inductors L0, L1 can be formed in multiple metal layers in series or in parallel.

Transformer legs 202, 204 and 206, 208 are coupled to respective coil portions. The transformer legs 202, 204 and 206, 208 comprise traces in the metallization of the backside dielectric layer(s) 132 of the base chip 102. The transformer legs 202, 204, 206, 208 can be connected to metal layers in the front side dielectric layer(s) 122 of the base chip 102, and to metal layers of other chips, through backside TSVs 162. Overlapping portions of the coil portions of the inductors L0, L1 in different metal layers are connected by vias along the length of the portion of the coil to provide larger coils to increase inductance. One or ordinary skill in the art would understand how to design a transformer to be formed with the multi-chip device of FIG.

Figure 3:
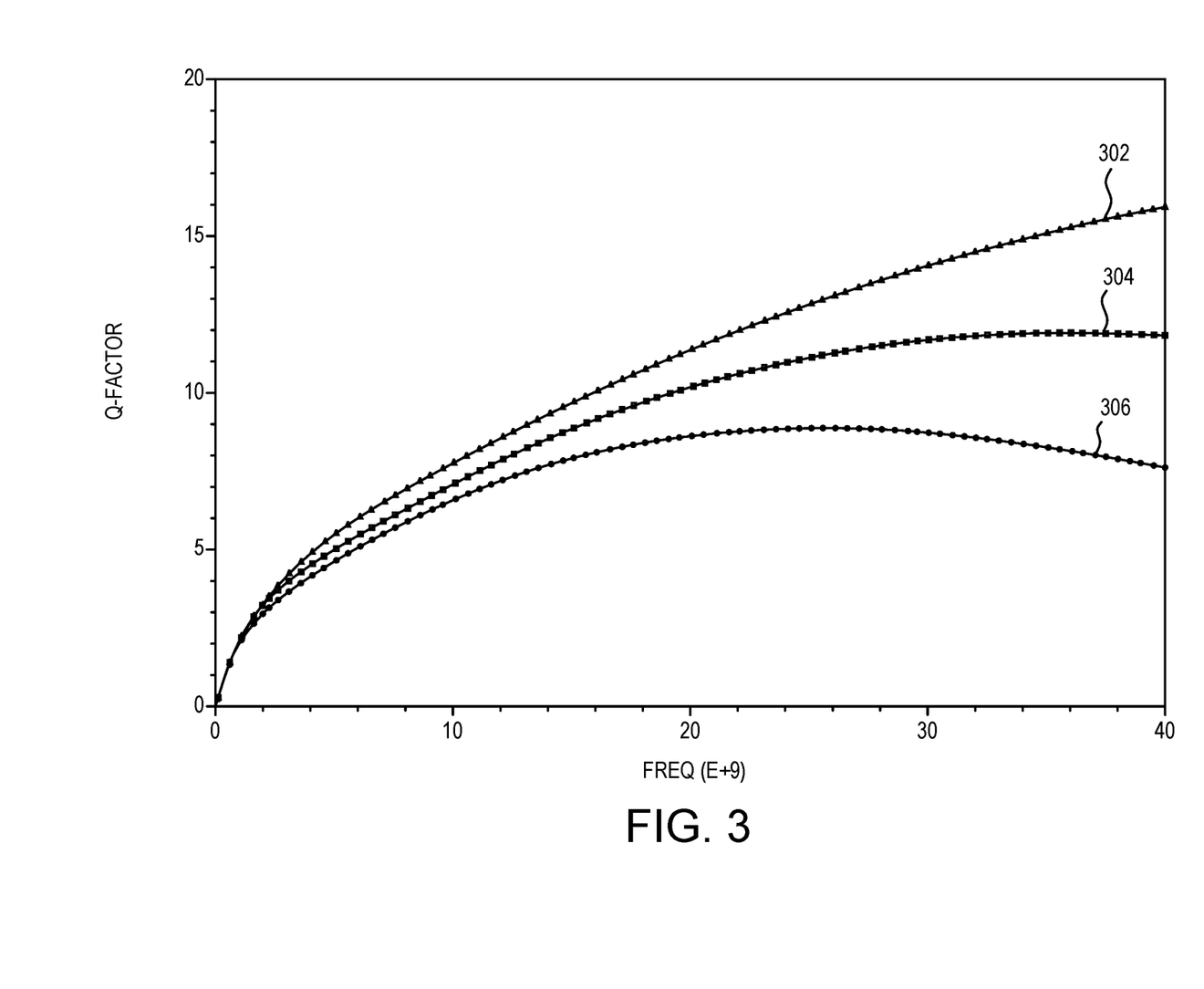
FIG. 3 illustrates effects on transformer performance in inductor Q-factor for different frequencies based on different substrate thicknesses, according to some examples.

FIG. 3 illustrates the effect on transformer performance in inductor Q-factor for different frequencies based on different thicknesses of semiconductor substrate 112 according to some examples. FIG. 3 illustrates the effects based on three different semiconductor substrate thicknesses for semiconductor substrate 112: 2.7 µm (302), 10 µm (304), and 100 µm (306). As illustrated, a thinner substrate thickness shows smaller degradation to inductor Q-factor and accordingly inductor performance, as frequency increases. A thinner substrate thickness also allows for more BTSVs, which in turn can benefit in lower resistive paths for power and signal integrity.

Figure 4A:
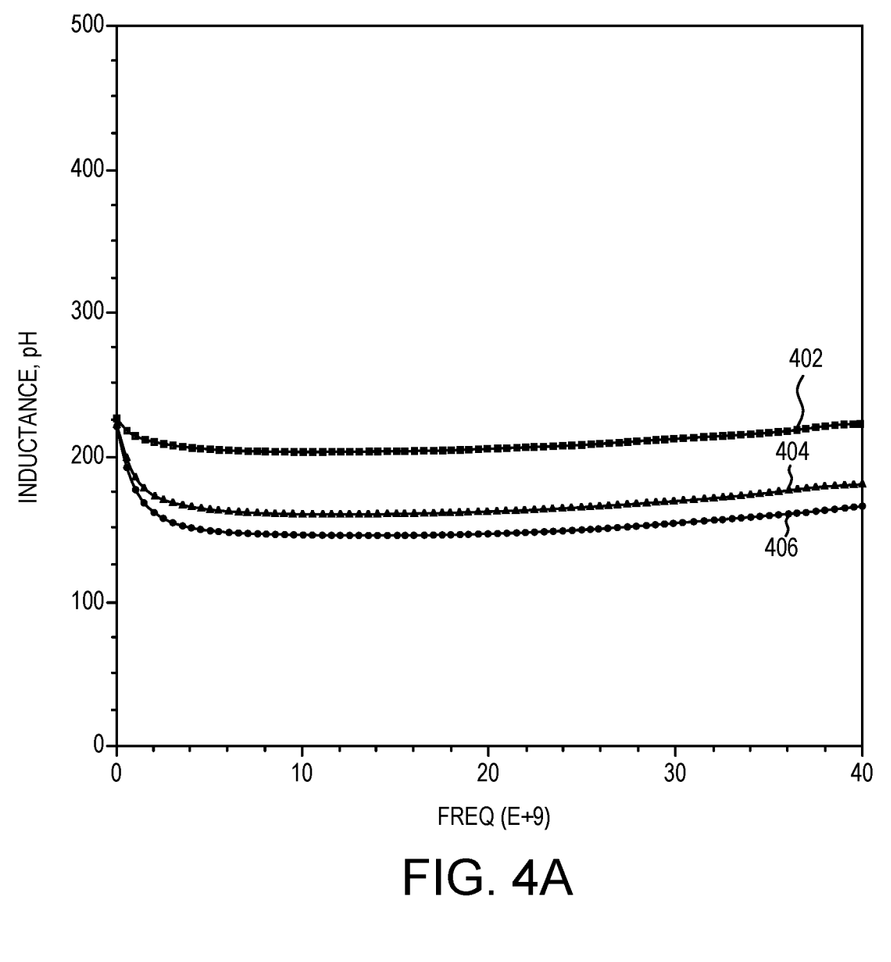
FIGS. 4A-4B illustrate inductance characteristics with and without an isolation wall in order to simulate shielding against the environmental effects of vertically stacked chips in a stacked integrated circuit (IC) environment, according to some examples.
Figure 4B:
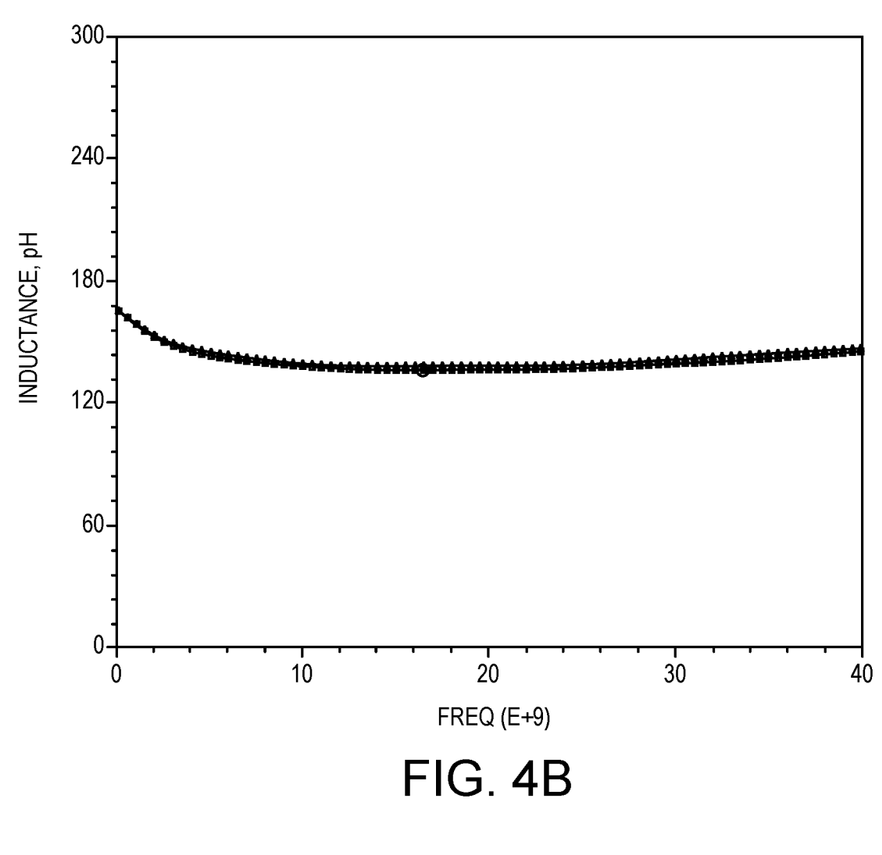

FIGS. 4A and 4B respectively illustrate inductance characteristics with and without the isolation wall in order to simulate shielding against the 3D environmental effects of vertically stacked chips in the stacked IC environment. FIG. 4A-4B also show the inductance characteristics of three different thicknesses of semiconductor substrate 112: 2.7 µm (402), 10 µm (402), and 100 µm (406). As shown by FIG. 4A, without the isolation wall, inductance of the inductor can vary dramatically in stacked ICs because different return paths are formed in different stacked IC environments. As shown in FIG. 4B, with the isolation wall, the inductance of the inductor becomes more stable and predictable in the stacked IC environment.

Figure 5A:
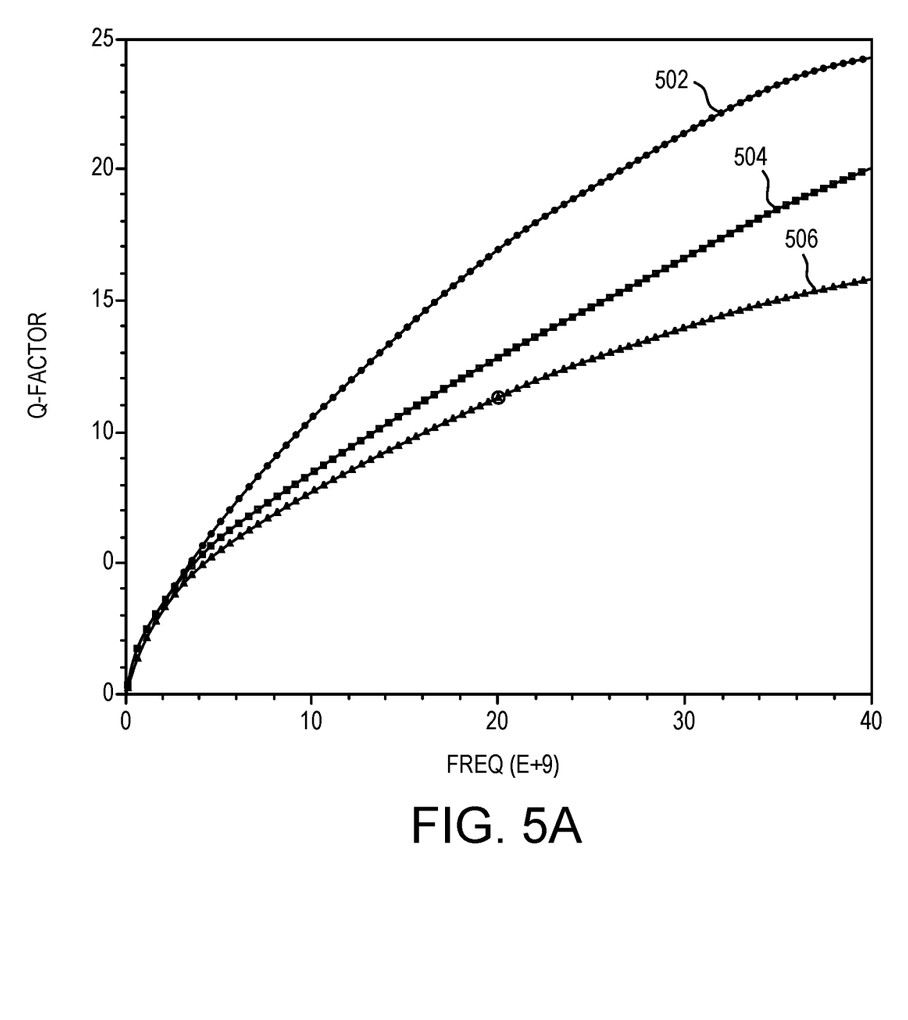
FIGS. 5A-5B illustrate Q-factor characteristics with and without the isolation wall, according to some examples.
Figure 5B:
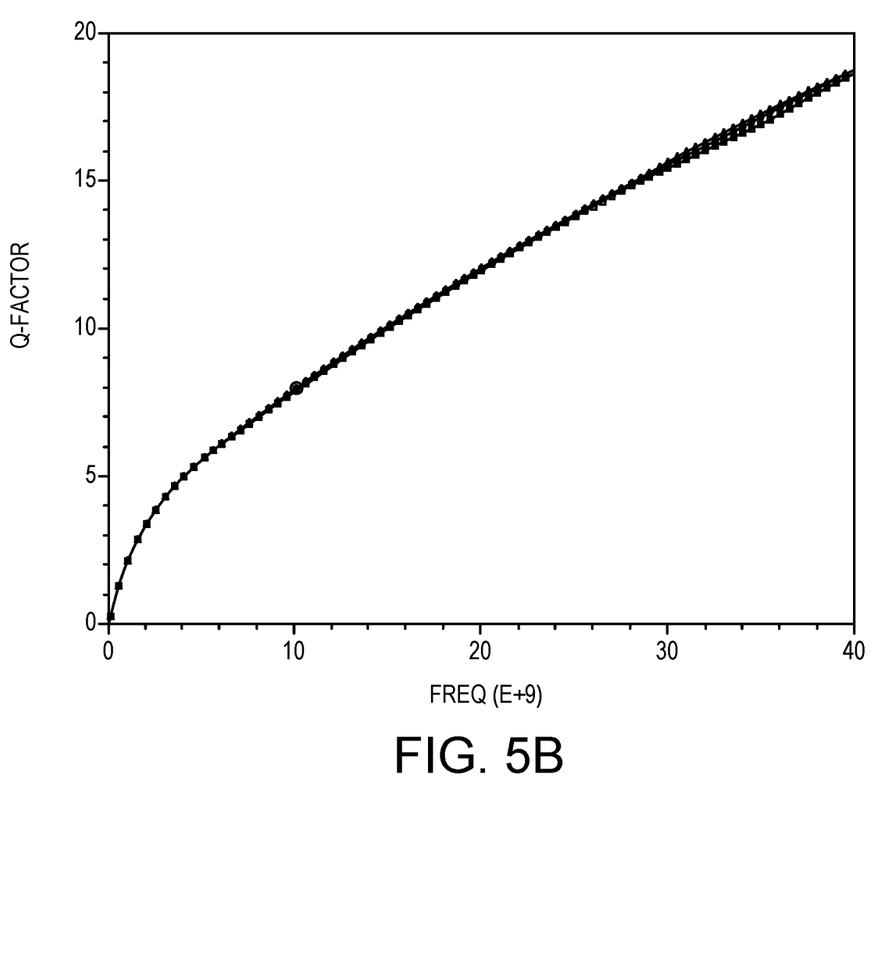

FIGS. 5A and 5B respectively illustrate the Q-factor characteristics with and without the isolation wall. FIG. 5A-5B also show the inductance characteristics of three different thicknesses of semiconductor substrate 112: 2.7 µm (502), 10 µm (504), and 100 µm (506). As shown by FIG. 5A, without the isolation wall, the Q-factor of the inductor changes differently based on the semiconductor substrate thicknesses. As shown by FIG. 5B, with the isolation wall, the Q-factor of the inductor stabilizes between the semiconductor substrate thicknesses in the stacked IC environment.

Accordingly, the multi-chip device including the isolation wall can demonstrate device performance metrics to meet VCO design requirements in an active 3D stacking environment.

Figure 6:
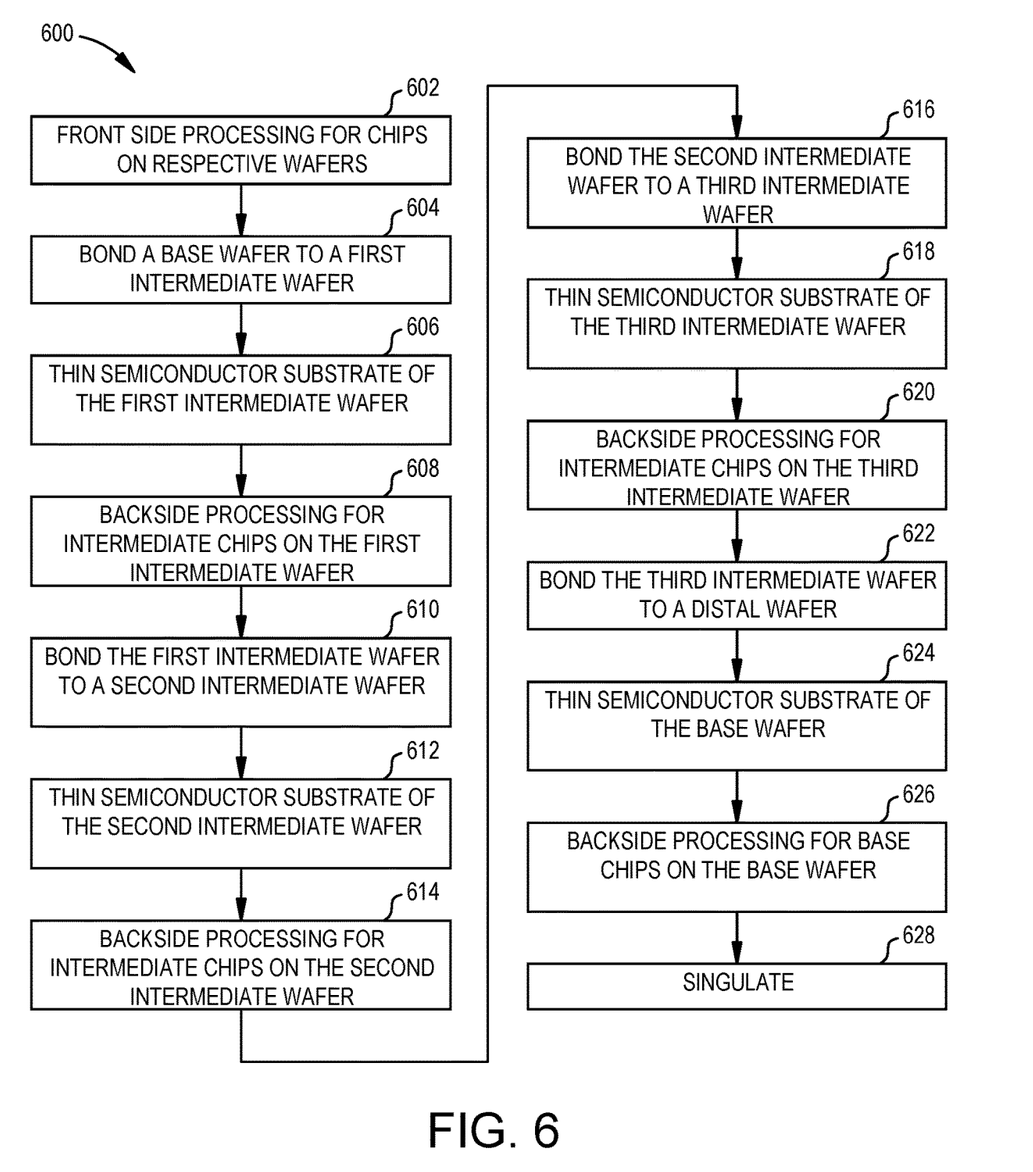
FIG. 6 is a flowchart of a method of forming the multi-chip device of FIG. 1 according to some examples.

FIG. 6 is a flowchart of a method 600 of forming the multi-chip device of FIG. 1 according to some examples. The processing of the method 600 of FIG. 6 is generally described, and a person having ordinary skill in the art will readily understand the more specific processing that can be performed. The more specific processing can be according to any semiconductor processing for forming an IC on substrate, which is to be singulated into a chip. For ease of description herein, a wafer on which one or more base chips 102 are formed is referred to as a base wafer; a wafer on which one or more intermediate chips 104 are formed is referred to as an intermediate wafer; and a wafer on which one or more distal chips are formed is referred to as a distal wafer. Any wafer can be any shape and/or size.

Referring to FIG. 6, at block 602, front side processing for chips on the respective wafers is performed. For example, front side processing of each semiconductor substrate 112, 114a, 114b, 114c, 118 (e.g., wafer) can include forming devices (e.g., transistors 142, 144a, 144b, 144c, 148) in and/or on the front surface of the semiconductor substrate 112, 114a, 114b, 114c, 118, and forming front side dielectric layer(s) 122, 124a, 124b, 124c, 128 with metallization and front side bond pads 152, 154a, 154b, 154c, 158 on the front surface of the semiconductor substrate 112, 114a, 114b, 114c, 118. Multiple base chips 102 can be formed on a base wafer. Multiple intermediate chips 104 can be formed on a plurality of intermediate wafers. Multiple distal chips 108 can be formed on a distal wafer.

In some examples, front side processing of a base wafer includes forming at least a portion of an isolation wall (e.g., isolation wall 192) in the front side dielectric layer(s) with metallization. Front side processing of the base wafer can also include forming a PGS (e.g., PGS 194) in the front side dielectric layer(s) with metallization.

At block 604, a base wafer is bonded to a first intermediate wafer, such as front side to front side bonding as shown in FIG. 1. As a result of the bonding, a front side of a base chip 102 is bonded to a front side of an intermediate chip 104a, as shown in FIG. 1. The bonding can be hybrid bonding, such as bonding front side bond pads 152 on the base wafer to front side bond pads 154a on the first intermediate wafer, and bonding the exterior surface of the front side dielectric layer(s) 122 on the base wafer to the exterior surface of the front side dielectric layer(s) 124a on the first intermediate wafer.

At block 606, the semiconductor substrate of the first intermediate wafer is thinned from a backside of the first intermediate wafer. As shown in FIG. 1, the semiconductor substrate 114a of the intermediate chip 104a is thinned from the backside. The thinning can be by a chemical mechanical polish (CMP) or other appropriate process.

At block 608, backside processing for intermediate chips on the first intermediate wafer is performed. As illustrated by FIG. 1, the backside processing can include forming backside TSVs 164a through the semiconductor substrate 114a of the first intermediate wafer and connecting to metallization in the front side dielectric layer(s) 124a on the first intermediate wafer. The backside processing can further include forming backside dielectric layer(s) 134a with metallization and backside bond pads 174a on the backside of the semiconductor substrate 114a. The metallization in the backside dielectric layer(s) 134a can be connected to the metallization in the front side dielectric layer(s) 124a through the backside TSVs 164a.

At block 610, the first intermediate wafer is bonded to a second intermediate wafer, such as backside to front side bonding as shown in FIG. 1. As a result of the bonding, a backside of an intermediate chip 104a is bonded to a front side of an intermediate chip 104b, as shown in FIG. 1. The bonding can be hybrid bonding, such as bonding backside bond pads 174a on the first intermediate wafer to front side bond pads 154b on the second intermediate wafer, and bonding the exterior surface of the backside dielectric layer(s) 134a on the first intermediate wafer to the exterior surface of the front side dielectric layer(s) 124b on the second intermediate wafer.

At block 612, the semiconductor substrate of the second intermediate wafer is thinned from a backside of the second intermediate wafer, like described with respect to block 606. As show in FIG. 1, the semiconductor substrate 114b of the intermediate chip 104b is thinned from the backside.

At block 614, backside processing for intermediate chips on the second intermediate wafer is performed, like described with respect to block 608. As illustrated by FIG. 1, the backside processing can include forming backside TSVs 164b through the semiconductor substrate 114b of the second intermediate wafer and connecting to metallization in the front side dielectric layer(s) 124b on the second intermediate wafer. The backside processing can further include forming backside dielectric layer(s) 134b with metallization and backside bond pads 174b on the backside of the semiconductor substrate 114b. The metallization in the backside dielectric layer(s) 134b can be connected to the metallization in the front side dielectric layer(s) 124b through the backside TSVs 164b.

At block 616, the second intermediate wafer is bonded to a third intermediate wafer, such as backside to front side bonding as shown in FIG. 1. As a result of the bonding, a backside of an intermediate chip 104b is bonded to the front side of an intermediate chip 104c, as shown in FIG. 1. The bonding can be hybrid bonding, such as bonding backside bond pads 174b on the second intermediate wafer to front side bond pads 154c on the second intermediate wafer, and bonding the exterior surface of the backside dielectric layer(s) 134b on the second intermediate wafer to the exterior surface of the front side dielectric layer(s) 124c on the third intermediate wafer.

At block 618, the semiconductor substrate of the third intermediate wafer is thinned from a backside of the third intermediate wafer, like described with respect to block 606. As shown in FIG. 1, the semiconductor substrate 114c of the intermediate chip 104c is thinned from the backside.

At block 620, backside processing for intermediate chips on the third intermediate wafer is performed, like described with respect to block 608. As illustrated by FIG. 1, the backside processing can include forming backside TSVs 164c through the semiconductor substrate 114c of the third intermediate wafer and connecting to metallization in the front side dielectric layer(s) 124c on the third intermediate wafer. The backside processing can further include forming backside dielectric layer(s) 134c with metallization and backside bond pads 174c on the backside of the semiconductor substrate 114c. The metallization in the backside dielectric layer(s) 134c can be connected to the metallization in the front side dielectric layer(s) 124c through the backside TSVs 164c.

At block 622, the third intermediate wafer is bonded to a distal wafer, such as backside to front side bonding as shown in FIG. 1. As a result of the bonding, a backside of an intermediate chip 104c is bonded to a front side of a distal chip 108, as shown in FIG. 1. The bonding can be hybrid bonding, such as bonding backside bond pads 174c on the third intermediate wafer to front side bond pads 158 on the distal wafer, and bonding the exterior surface of the backside dielectric layer(s) 134c on the third intermediate wafer to the exterior surface of the front side dielectric layer(s) 128 on the distal wafer.

At block 624, the semiconductor substrate of the base wafer is thinned from a backside of the base wafer, like described with respect to block 606. As shown in FIG. 1, the semiconductor substrate 112 of the base chip 102 is thinned from the backside.

At block 626, backside processing for base chips on the base wafer is performed, like described with respect to block 608. As illustrated by FIG. 1, the backside processing can include forming backside TSVs 162 through the semiconductor substrate 112 of the base wafer and connecting to metallization in the front side dielectric layer(s) 122 on the base wafer. The backside processing can further include forming backside dielectric layer(s) 132 with metallization and exterior connector backside pads 172 on the backside of the semiconductor substrate 112. The metallization in the backside dielectric layer(s) 132 can be connected to the metallization in the front side dielectric layer(s) 122 through the backside TSVs 162. The backside processing for the base chips 102 can further include forming the passivation layer 180 and external connectors 182. Backside processing of the base chip can include forming an inductor (e.g., inductor 190) and at least a portion of an isolation wall (e.g., isolation wall 192).

At block 628, the bonded wafers are singulated (e.g., by sawing) to separate individual multi-chip devices that have been formed. Each of the multi-chip devices can be as shown in FIG. 1.

While the foregoing is directed to specific examples, other and further examples may be devised without departing from the basic scope thereof, and the scope thereof is determined by the claims that follow.

What is claimed is:

1. A multi-chip device comprising:
    a chip stack comprising a plurality of chips, neighboring pairs of the plurality of chips being bonded together, each chip comprising a semiconductor substrate and a front side dielectric layer on a front side of the semiconductor substrate;
    an inductor disposed in a backside dielectric layer of a first chip of the plurality of chips, the backside dielectric layer of the first chip being on a backside of the semiconductor substrate of the first chip opposite from the front side of the semiconductor substrate of the first chip; and
    an isolation wall extending from the backside dielectric layer of the first chip to the front side dielectric layer of the first chip, the isolation wall comprising a through substrate via (TSV) through the semiconductor substrate of the first chip, the isolation wall being disposed around the inductor.

2. The multi-chip device of claim 1, wherein the front side dielectric layer is an outermost dielectric layer in which metallization is disposed.

3. The multi-chip device of claim 1, wherein the first chip is an input/output (I/O) chip.

4. The multi-chip device of claim 1, wherein the semiconductor substrate comprises intrinsic silicon in a region of the semiconductor substrate corresponding with a position of the inductor.

5. The multi-chip device of claim 1, wherein the semiconductor substrate of the first chip has a thickness less than or equal to 2.7 um.

6. The multi-chip device of claim 1, wherein at least one of the plurality of chips comprises a processing integrated circuit.

7. The multi-chip device of claim 1, further comprising a pattern ground shield (PGS) disposed in the front side dielectric layer of the first chip, wherein the isolation wall surrounds and is electrically connected to the PGS.

8. The multi-chip device of claim 1, wherein the isolation wall further extends into a second chip bonded to the first chip.

9. The multi-chip device of claim 1, wherein at least one chip of the plurality of chips further comprises:
    one or more front side metallization layers disposed in the front side dielectric layer, the one or more front side metallization layers comprising a top metallization layer disposed distal from the semiconductor substrate of the respective chip; and
    one or more backside metallization layers disposed in the backside dielectric layer, the one or more backside metallization layers comprising a bottom metallization layer disposed distal from the semiconductor substrate of the respective chip.

10. The multi-chip device of claim 1, wherein the isolation wall extends through more than one of the plurality of chips.

11. A method for constructing a multi-chip device, the method comprising:
    forming a stack of a plurality of chips comprising forming the plurality of chips, each chip comprising a semiconductor substrate and a front side dielectric layer on a front side of the semiconductor substrate, wherein forming a first chip of the plurality of chips includes:
        forming an inductor disposed in a backside dielectric layer of the first chip of the plurality of chips, the backside dielectric layer being on a backside of the semiconductor substrate of the first chip opposite from the front side; and
        forming an isolation wall extending from the backside dielectric layer of the first chip to the front side dielectric layer of the first chip, the isolation wall comprising a through-substrate via (TSV) through the semiconductor substrate of the first chip, the isolation wall being disposed around the inductor.

12. The method of claim 11, wherein the front side dielectric layer of the first chip is an outermost dielectric layer in which metallization is disposed.

13. The method of claim 11, wherein the semiconductor substrate comprises intrinsic silicon in a region of the semiconductor substrate corresponding with a position of the inductor.

14. The method of claim 11, wherein the semiconductor substrate has a thickness of less than or equal to 2.7 um.

15. The method of claim 11, wherein the plurality of chips comprise Active-on-Active (AoA) chips.

16. The method of claim 11, further comprising forming a pattern ground shield (PGS) disposed in the front side dielectric layer of the first chip, wherein the isolation wall surrounds and is electrically connected to the PGS.

17. The method of claim 11, wherein the isolation wall further extends into a second chip bonded to the first chip.

18. The method of claim 11, wherein the isolation wall extends through more than one of the plurality of chips.

19. A multi-chip device comprising:
    a chip stack;
    an inductor disposed in a backside dielectric layer of a first chip of the chip stack; and
    an isolation wall extending from the backside dielectric layer of the first chip to a front side dielectric layer of the first chip, the isolation wall being disposed around the inductor.

20. The multi-chip device of claim 19, further comprising a pattern ground shield (PGS) disposed in the front side dielectric layer of the first chip, wherein the isolation wall surrounds and is electrically connected to the PGS.

* * * * *

UNITED STATES PATENT AND TRADEMARK OFFICE
CERTIFICATE OF CORRECTION

PATENT NO.       : 11,043,470 B2                                  Page 1 of 1
APPLICATION NO.  : 16/694476
DATED            : June 22, 2021
INVENTOR(S)      : Jing Jing et al.

It is certified that error appears in the above-identified patent and that said Letters Patent is hereby corrected as shown below:

In the Specification

Column 8, Line 10, Delete "FIG." and insert -- FIG. 1. --, therefor.

Signed and Sealed this
Fifth Day of October, 2021

Drew Hirshfeld
*Performing the Functions and Duties of the*
*Under Secretary of Commerce for Intellectual Property and*
*Director of the United States Patent and Trademark Office*